US005847401A

United States Patent [19]

McKeown et al.

[11] Patent Number: 5,847,401

[45] Date of Patent: Dec. 8, 1998

[54] SIMULTANEOUS DOUBLE SIDED IRRADIATION

[75] Inventors: Joseph McKeown, Kanata, Canada; Marshall R. Cleland, Hauppage, N.Y.; Norbert H. Drewell; Courtlandt B. Lawrence, both of Kanata, Canada; Walter Garfield Davies, Deep River, Canada

[73] Assignee: Atomic Energy of Canada Limited, Ottawa, Canada

[21] Appl. No.: 742,382

[22] Filed: Nov. 1, 1996

[51] Int. Cl.[6] .......... H01J 37/30

[52] U.S. Cl. .......... 250/396 ML; 250/492.3

[58] Field of Search .......... 250/492.3, 396 ML, 250/398

[56] References Cited

U.S. PATENT DOCUMENTS

| | | | |
|---|---|---|---|
| 2,741,704 | 4/1956 | Trump . | |
| 4,121,086 | 10/1978 | Auslender et al. . | |
| 4,295,048 | 10/1981 | Cleland et al. . | |
| 4,367,412 | 1/1983 | Cheever | 250/492.3 |
| 4,870,287 | 9/1989 | Cole et al. | 250/492.2 |
| 5,004,926 | 4/1991 | Vassenaix et al. | 250/492.3 |
| 5,124,554 | 6/1992 | Fowler et al. | 250/358.1 |
| 5,401,973 | 3/1995 | McKeown et al. | 250/492.3 |
| 5,449,916 | 9/1995 | Smyth et al. | 250/492.3 |

FOREIGN PATENT DOCUMENTS

| | | |
|---|---|---|
| 2403302 | 4/1979 | France . |
| 0360655 | 3/1988 | France . |
| 2000634 | 1/1979 | United Kingdom . |

OTHER PUBLICATIONS

K. Uehara, Radiation Physics and Chemistry, "An Efficient Irradiation Apparatus with Magnet for Wire and Cable", vol. 9 No. 4–6; pp. 593–597, 1977.

E.E. Finkel, Yu N. Timko and Yu M. Timoshin, Radiation Physics and Chemistry "Use of Magnetic Systems for Increase on Irradiation Efficiency of Long–Sized Products and Better Uniformity of Radiation Absorbed Doses", vol. 11, No. 3–5, pp. 387–390, 1983.

*Primary Examiner*—Bruce Anderson
*Attorney, Agent, or Firm*—Emrich & Dithmar

[57] ABSTRACT

An apparatus for delivering a beam of charged particles along two separate beam paths comprising a pulsed charged particle beam source for producing a series of beam pulses along a first beam path, a switching magnet for developing a magnetic field, and a power supply means for selectively applying current pulses to said switching magnet in timed relation to each of a plurality of predetermined beam pulses effective to develop a constant magnetic field throughout the period of each predetermined beam pulse and deflect each entire predetermined beam pulse from said first beam path to a second beam path.

26 Claims, 4 Drawing Sheets

SIMULTANEOUS DOUBLE SIDED IRRADIATION

This invention relates to the processing of industrial materials with electron beam irradiation.

BACKGROUND OF THE INVENTION

The processing of industrial materials with ionizing radiation is divided into two distinct modalities; electron beam irradiation and gamma irradiation. The former employs a beam of electrons that has been accelerated to a high energy by particle accelerators whereas the latter is derived from the photons emitted by radioactive nuclei such as $^{60}$Co and $^{137}$Cs. Once the photon interacts with matter, the cascading interactions with the electrons in the target are almost identical to that initiated by the primary electrons from the accelerator. Nevertheless, the industrial applications of these two modalities are just as dissimilar as the characteristics of their origin. Electron beams are used to cross-link materials to a depth of a few centimeters while gamma rays are used almost exclusively for penetrating deep into medical products for the purpose of sterilizing the product. These applications are distinct because of the ability of the gamma ray to penetrate deeply into the product before interacting while primary electrons from accelerators interact immediately and accordingly are used for surface treatment.

The longstanding difficulty with the limited penetration of the primary electron beam has captured the attention of accelerator designers for several decades. The underlying common approach was to increase the energy of the primary electron beam by innovative accelerator design. This brought many new technologies into the industrial arena including dc accelerators of the type, the Cockroft Walton (<5 MeV), the Insulated Core Transformer (<3 MeV), the Dynamitron (<5 MeV) and radiofrequency accelerators (10 MeV) of the type; short pulsed linac, continuous wave accelerators and long pulsed linear accelerators such as IMPELA marketed by the applicant. Most industrial dc accelerators have a fundamental difficulty in reaching energies above 5 MeV while it is only recently that radio frequency accelerators have acquired enough power to qualify for industrial use. Because of the inherent ability of creating radioactive nuclei in the product being irradiated, the World Health Organization has imposed a limit of 10 MeV for the irradiation of food and a similar energy limit has been set for the sterilization of medical products in Europe.

At the energy limit of 10 MeV, the penetration deficiency of the primary electrons for some applications is countered by converting the electrons to photons by allowing them to interact with nuclei of high atomic number. Conversion of the electron beam into photons has been used in pilot plant operations for the cross-linking of composite materials. The process is very inefficient as only about 16% of the primary beam energy is converted to bremsstrahlung in the forward hemisphere, with the remainder being lost as heat in the converter. The inefficiency is compounded by the transmission of the high energy photon beam through the product without interaction.

A further method of achieving effective penetration of thick products is to pass the product through the beam two or more times, presenting a different face to the beam on each pass. In the simplest form of this method, the article is irradiated on one side and is turned 180° and then passed through the beam again. This gives more than twice the penetration of a single pass and works well for many products. However, for many products, where the internal position of components is not fixed, such a technique is not possible. For example, a box of chicken parts usually includes a volume of fluid at the bottom that could be contaminated with bacteria. Irradiating the box from the top with electrons of insufficient range will leave the fluid untouched. Turning the box over and passing it through again does not solve the problem. Similarly, for boxes containing medical products, there is risk that some of the contents will receive exposure that is less than sufficient to achieve sterilization.

Other methods of uniformly irradiating objects has been proposed. In *Radiation Physics and Chemistry*, Vol. 9, Nos. 4–6, pp. 593–597, 1977, Ken-ichiro Uehara discloses the use of magnets to turn an electron beam 180° to permit an article to be irradiated at the same time on both sides. The method is used to irradiate wire and magnetically redirects electrons passing through the gap between adjacent wires. Accordingly, the method is inapplicable to applications in which the incident beam is totally absorbed by the article being irradiated. Similarly, in *Radiation Physics and Chemistry*, Vol. 22, Nos. 3–5. pp. 387–390, 1983, Finkel et al. disclose the use of magnets to create a circular field of irradiation to more uniformly irradiate wire and cable. Such a method would not be effective to irradiate large articles.

In U.S. Pat. No. 4,295,048 Cleland et al., there is disclosed an apparatus to irradiate two sides of an article. FIG. 10 discloses the use of switching magnet 94' to deflect the electron beam alternately from one magnetic scanning assembly to the other. The arrangement disclosed in Cleland has critical limitations which render it generally unsuitable as a practical device. Presumably, Cleland applies a continuous electron beam and causes switching magnet 94' to cycle continuously between states. However, Cleland discloses no means to synchronize delivery of the electron beam to switching magnet 94'. As a result, during periods when the magnetic field produced by switching magnet 94' is building up or collapsing in response to a reversing electrical drive signal, the angle of deflection of the beam will vary in time from one deflection limit to the other. During this time, the beam will not be directed into either of the optical paths that lead to the magnetic scanning assemblies on either side of the article to be irradiated, but instead will be scattered in the switching magnet assembly. Switching magnets are typically disposed in a vacuum box and the scattered energy of the beam would have to be absorbed or dissipated, likely by a water cooled beam stop arrangement. A further disadvantage of the Cleland arrangement is that it would not deliver a constant level of irradiation over time. Because of the periodic scattering or “spill” of beam while it undergoes deflection in switching magnet 94', the strength of beam that is delivered to the article will also vary with time. This creates significant difficulties in delivering a precise and even dose of irradiation to the article throughout each scan.

U.S. Pat. No. 2,741,704 Trump et al., discloses an electron beam splitting arrangement similar to that of Cleland. As with Cleland, a continuous electron beam is alternately split between two beam paths. Trump recognizes the difficulty in coping with the beam energy that is scattered as the beam is shifted from one path to another and proposes a unique electrical diaphragm to lessen electron bombardment and also indicates the desirability of water cooling.

BRIEF SUMMARY OF THE INVENTION

The present invention provides an apparatus and method for alternately delivering a uniform dose of charged particle irradiation through different beam paths without incurring the limitations associated with beam scattering during switching of the beam between the paths.

Thus in accordance with the present invention there is provided an apparatus for delivering a beam of charged particles along two separate beam paths comprising a pulsed charged particle beam source for producing a series of beam pulses along a first beam path; switching magnet for developing a magnetic field; power supply means for selectively applying current pulses to said switching magnet in timed relation or synchronized to each of a plurality of predetermined beam pulses effective to develop a constant magnetic field throughout the period of each predetermined beam pulse and deflect each entire predetermined beam pulse from said first beam path to a second beam path.

In accordance with another aspect of the invention, there is provided an apparatus for delivering a beam of charged particles along two separate beam paths comprising a pulsed charged particle beam source for producing a series of beam pulses; switching magnet responsive to a first and second current for developing a first and second magnetic field; power supply means for selectively applying to said switching magnet a first current pulse in timed relation to each of a plurality of predetermined first path beam pulses effective to develop a constant first magnetic field throughout the period of each predetermined first path beam pulse and thereby deflect each entire predetermined first path beam pulse to said first beam path, and a second current pulse in timed relation to each of a plurality of predetermined second path beam pulses effective to develop a constant second magnetic field throughout the period of each predetermined second path beam pulse and thereby deflect each entire predetermined second path beam pulse to said second beam path.

In accordance with another aspect of the invention, there is provided an apparatus for delivering a beam of charged particles along four separate beam paths comprising a pulsed charged particle beam source for producing a series of beam pulses along a linear axis; first switching magnet responsive to a first and second current for developing a first and second magnetic field; second switching magnet responsive to a third and fourth current for developing a third and fourth magnetic field; power supply means for selectively applying to said first switching magnet a first current pulse in timed relation to each of a plurality of predetermined first path beam pulses effective to develop a constant first magnetic field throughout the period of each first path beam pulse and thereby deflect each entire first path beam pulse from said linear axis to a first beam path, and a second current pulse in timed relation to each of a plurality of predetermined second path beam pulses effective to develop a constant second magnetic field throughout the period of each second path beam pulse and thereby deflect each entire second path beam pulse from said linear axis to a second beam path, and for selectively applying to said second switching magnet a third current pulse in timed relation to each of a plurality of predetermined third path beam pulses effective to develop a constant third magnetic field throughout the period of each third path beam pulse and thereby deflect each entire third path beam pulse from said linear axis to a third beam path, and a fourth current pulse in timed relation to each of a plurality of predetermined fourth path beam pulses effective to develop a constant fourth magnetic field throughout the period of each predetermined fourth path beam pulse and thereby deflect each entire fourth path beam pulse from said linear axis to a fourth beam path.

In accordance with another aspect of the invention, there is provided a method for delivering a beam of charged particles along two separate beam paths comprising producing from a pulsed charged particle beam source a series of beam pulses along a first beam path; directing said first beam path through the field of a switching magnet; selectively applying current pulses to said switching magnet in timed relation to each of a plurality of predetermined beam pulses effective to develop a constant magnetic field throughout the period of each predetermined beam pulse and thereby deflect each entire predetermined beam pulse from said first beam path to a second beam path.

In accordance with another aspect of the invention, there is provided a method for delivering a beam of charged particles along two separate beam paths comprising producing from a pulsed charged particle beam source a series of beam pulses along a linear axis; directing said axis through the field of a switching magnet; selectively applying to said switching magnet a first current pulse in timed relation to each of a plurality of predetermined first path beam pulses effective to develop a constant first magnetic field throughout the period of each predetermined first path beam pulse and thereby deflect each entire predetermined first path beam pulse to said first beam path, and a second current pulse in timed relation to each of a plurality of predetermined second path beam pulses effective to develop a constant second magnetic field throughout the period of each predetermined second path beam pulse and thereby deflect each entire predetermined second path beam pulse to said second beam path.

In accordance with another aspect of the invention, there is provided a method for delivering a beam of charged particles along four separate beam paths comprising producing from a pulsed charged particle beam source a series of beam pulses along a linear axis; directing said axis through the field of a first and second switching magnet displaced longitudinally along said axis; selectively applying to said first switching magnet a first current pulse in timed relation to each of a plurality of predetermined first path beam pulses effective to develop a constant first magnetic field throughout the period of each first path beam pulse and thereby deflect each entire first path beam pulse from said linear axis to a first beam path, and a second current pulse in timed relation to each of a plurality of predetermined second path beam pulses effective to develop a constant second magnetic field throughout the period of each second path beam pulse and thereby deflect each entire second path beam pulse from said linear axis to a second beam path; selectively applying to said second switching magnet a third current pulse in timed relation to each of a plurality of predetermined third path beam pulses effective to develop a constant third magnetic field throughout the period of each third path beam pulse and thereby deflect each entire third path beam pulse from said linear axis to a third beam path, and a fourth current pulse in timed relation to each of a plurality of predetermined fourth path beam pulses effective to develop a constant fourth magnetic field throughout the period of each predetermined fourth path beam pulse and thereby deflect each entire fourth path beam pulse from said linear axis to a fourth beam path.

Other embodiments include means for directing said first and second beam path pulses to opposite sides of an article to be irradiated, to first and second articles to be irradiated and to opposite sides of first and second articles to be irradiated.

BRIEF DESCRIPTION OF THE DRAWINGS

In drawings which represent embodiments of the present invention.

DETAILED DESCRIPTION OF THE PREFERRED EMBODIMENTS

Figure 1:
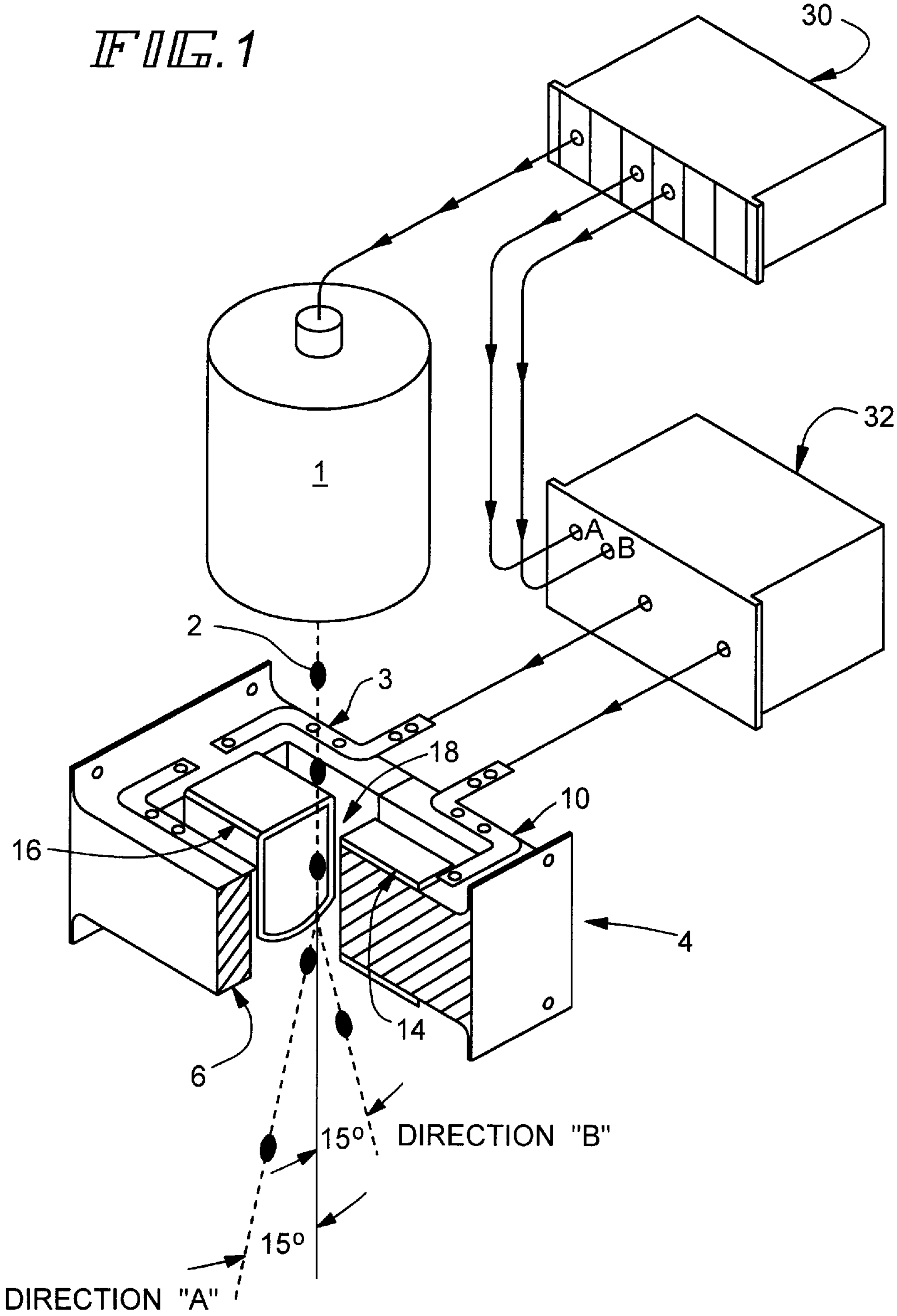
FIG. 1 is a schematic representation in perspective showing a switching magnet, in part sectional view, for deflecting a pulsed electron beam in accordance with the present invention.

Referring to FIG. 1, pulsed RF linear accelerator 1 produced and marketed under the name IMPELA by the applicant produces electron beam 2. IMPELA accelerator 1 operates at 10 MeV and within the power range of 20 to 250 kW. Accelerator 1 consists of a series of radiofrequency coupled cavities that accelerate an injected direct current 100 mA beam from 40 kV to 10 MeV. The radiofrequency system is pulsed and during the time when the beam is ON, the total peak power is 1 MW.

Electron beam 2 produced by IMPELA accelerator 1 has time characteristics particularly suitable for use in the present invention. Beam 2 is alternately pulsed ON and OFF 250 times per second. A 5% duty factor and an average power of 50 kW is achieved by pulsing beam 2 ON for 200 μsec and OFF for 3–8 msec. In IMPELA accelerator 1, the physics of the process are independent of average power, i.e., the beam current, accelerating gradient and beam loading are always constant. Hence, average power is chosen by selecting the pulse width and repetition rate and the power consumed is directly related to the irradiation requirements.

Pulsed beam 2 is directed into switching magnet 4. Switching magnet 4 develops a field which is sufficient to deflect beam 2 by 15°. Pulsed beam 2 is deflected by 15° in direction "A" when energized with current of one polarity and by 15° in direction "B" when energized with current of opposite polarity.

Switching magnet 4 is preferably a laminated core magnet to minimize eddy currents. Core 6 is constructed in the form of two E-shaped sections 8 and 10, using laminated silicon steel sheets 0.35 mm thick. Coils 14 and 16 are placed on the centre columns of E-shaped sections 8 and 10. The pole face of each center column is 120 mm×80 mm and gap 18 is 84 mm wide. To minimize heating, coils 14 and 16 have a very low resistance of 18 mohm. Switching magnet 4 has relatively small inductance of 400 μH. Pulsed beam 2 passes through gap 18 and can be enclosed with any suitable vacuum envelope (not shown), such as a thin wall bellows, to reduce losses and consequent heating. When driven by a current of 300 amps, switching magnet 4 is effective to develop a field of 700 gauss over 12 cm in gap 18 which is sufficient to deflect pulsed beam 2 by 15°.

Referring to FIG. 1, master timing generator 30 provides the control signal for synchronizing accelerator 1 and switching magnet power supply 32. Switching magnet 4 is energized about 250 μs before the start of each pulse. This is sufficient to permit switching magnet 4 to develop sufficient field strength to deflect the electron beam before the beam 2 is pulsed ON. When beam 2 is pulsed OFF, the power supply to switching magnet 4 is also turned off and the magnetic field collapses and remains dormant until about 250 μs before the next beam pulse when switching magnet 4 is again energized.

Figure 2:
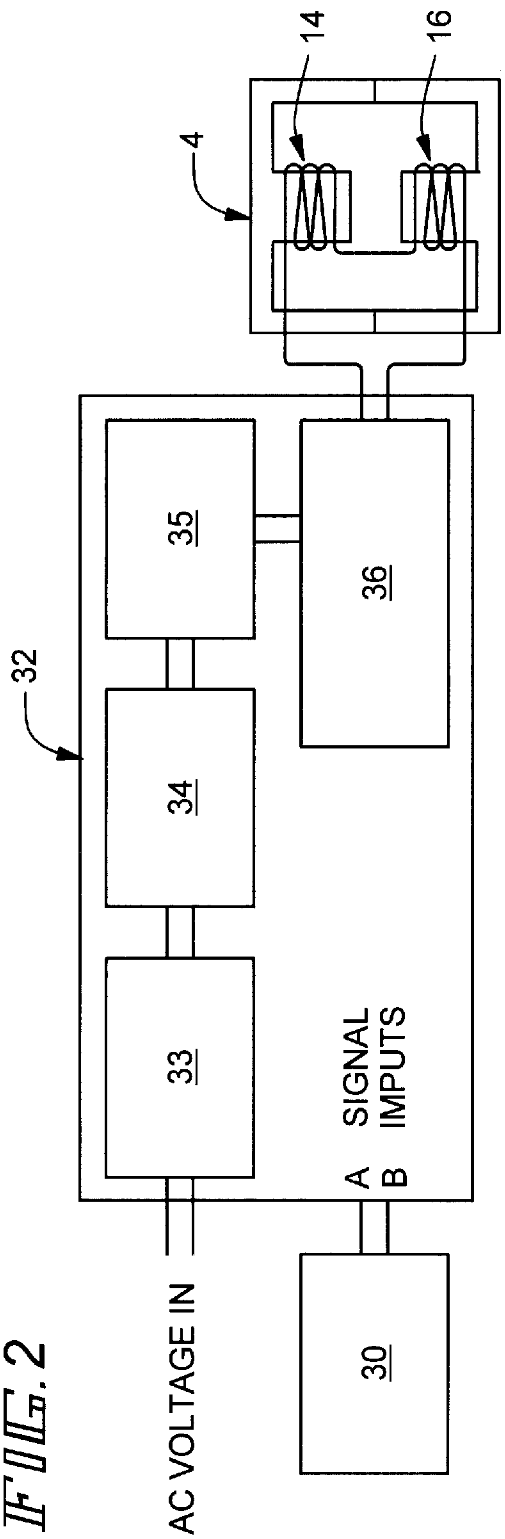
FIG. 2 is a block diagram of a switching magnet power supply suitable for use in the present invention.

Switching magnet 4 is powered by any suitably controlled power supply 32 effective to ramp the current to full deflection value before pulsed beam 2 is turned ON and to maintain the magnetic field constant throughout the duration of the beam pulse. Referring to FIG. 2 there is shown a block diagram of one suitable power supply arrangement for driving switching magnet 4 in the present invention. Power supply 32 includes DC voltage supply 33 which maintains 10,800 μF capacitor bank 34 at 410 volts, and includes bi-polar bridge driver 35 and bidirectional current regulator 36. Power supply 32 is arranged to accept two trigger signals. A signal at input "A" which is derived from master timing generator 30 causes the discharge current through coils 14 and 16 of switching magnet 4 to flow in one direction and causes a beam deflection in the direction "A" in FIG. 1, and a signal at input "B" causes the discharge current through coils 14 and 16 to flow in the opposite direction and causes a beam deflection in direction "B".

Master timing generator 30 can be programmed to deliver pulses at inputs "A" and "B" in any desired sequence, thereby determining the relative beam power delivered in deflection directions "A" and "B". The deflection sequence is initiated by the discharge of capacitor bank 34 through coils 14 and 16. The discharge current takes about 200 μsec to rise from 0 to 300 amps, at which time bidirectional current regulator 36 is turned on. Typically, 50 μsec is required for regulator 36 to settle. After a total delay of about 250 μsec, the current delivered to coils 14 and 16 is kept constant by regulator 36.

Figure 3:
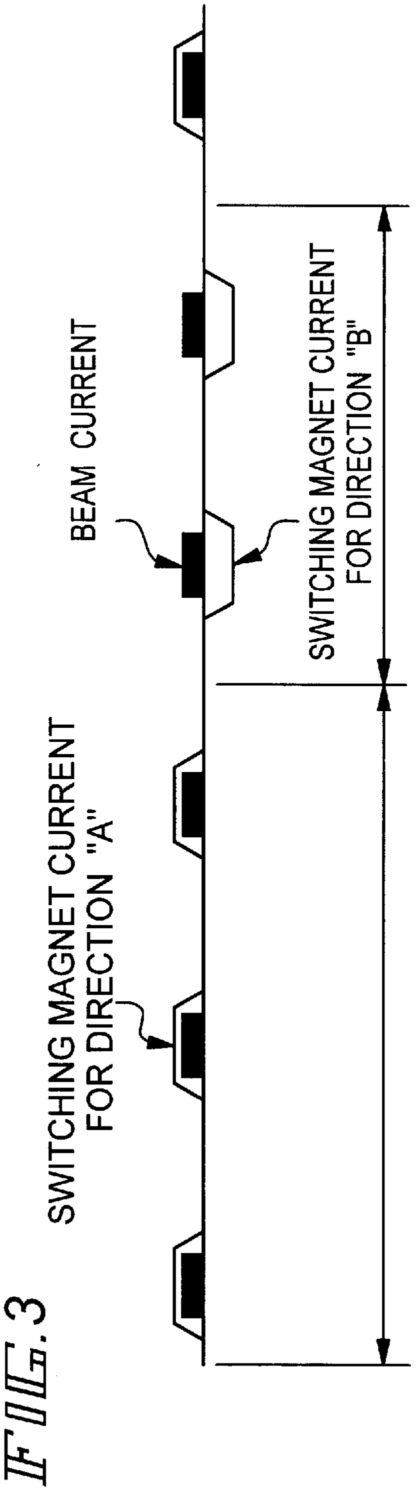
FIG. 3 is a graphical representation showing synchronization between the switching magnet current and beam pulse current.

Referring to FIG. 3, there is shown the timing relationship for synchronizing the discharge current through coils 14 and 16 of switching magnet 4 to pulsed electron beam 2. Pulsed beam 2 is pulsed ON for 200 μsec intervals and OFF for 3–8 msec intervals. The power supply sequence is initiated by a trigger signal at input "A" or "B" from master timing generator 30 which initiates the discharge of capacitor bank 34 about 250 μsec before the start of each 200 μsec beam pulse. By suitable programming of master timing generator 30, predetermined beam pulses can be selectively deflected into different beam paths. For example, as shown in FIG. 3, a sequence of three consecutive beam pulses can be deflected in direction "A" by the application of switching magnet current of first polarity and a sequence of two consecutive beam pulses can be deflected in direction "B" by the application of switching magnet current of second polarity. As will be evident to those skilled in the art, by appropriate selection of the number of pulses deflected into each path, the respective power delivered by each path can be accurately controlled. Where the power to be delivered by each path is the same, an equal number of pulses will be deflected into each beam path, either by alternating successive pulses, or successive trains having equal numbers of pulses, between each path.

Figure 4:
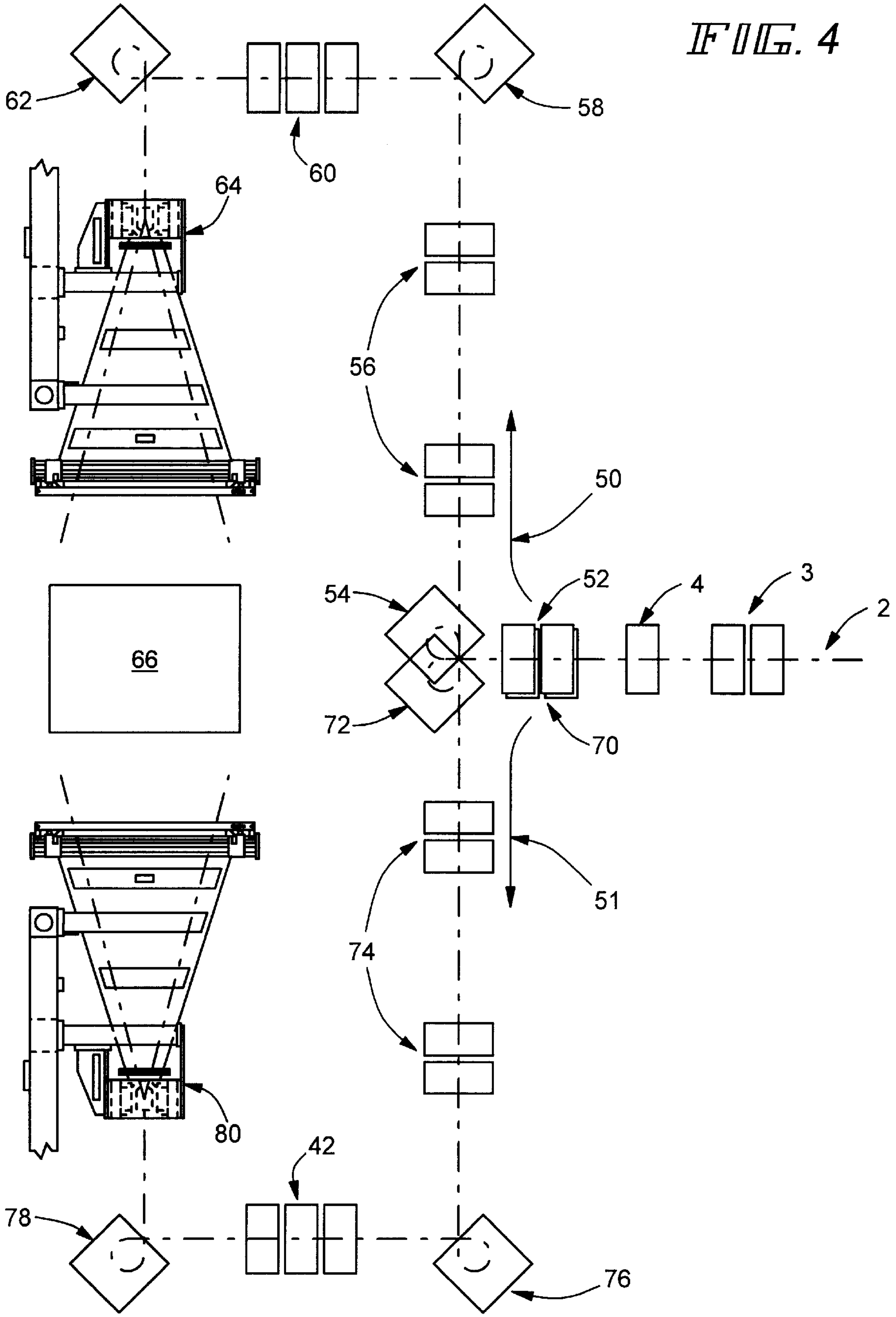
FIG. 4 is a schematic plan view of an apparatus for splitting a pulsed electron beam into two independent beams and applying said beams to an article to be irradiated from opposite directions.

Referring to FIG. 4, there is shown an apparatus for splitting a pulsed electron beam in accordance with the present invention and applying the two beams to opposite sides of an article. Pulsed beam 2 is applied to switching magnet 4 which splits beam 2 into two beams which lie in the horizontal plane 30° apart, in the manner described above with reference to FIG. 1. One of the split beams is passed through an upper beam path generally designated by reference numeral 50 and the other through a lower beam path generally designated by reference numeral 51.

Because the energy spread of beam 2 can be large (~10%), the dispersive effects of switching magnet 4 must be minimized. Quadrupole doublet 3 focuses beam 2 from accelerator 1 into switching magnet 4 so as to minimize the momentum dispersion of the beam exiting switching magnet 4. Each quadrupole in quadrupole doublet 3 is of a standard commercially available design and operates in dc mode. Referring first to upper beam 50, beam 2 as it is deflected from switching magnet 4 is passed through quadrupole doublet 52 which refocuses the divergent beam exiting switching magnet 4 and is effective to provide a nearly parallel beam 2 into first pretzel magnet 54.

Pretzel magnet 54 and is of the type described by H. A. Enge in *Achromatic Magnetic For Ion Beams*, Rev. Sci. Inst. v. 34 No. 4, p. 385, April 1963 and is characterized by its ability to deflect charged particle beams with a large energy spread by the same angle while at the same time not imparting any focussing properties. Because pretzel magnets have asymmetric optical properties in their radial and axial directions, beam preparation to maximize transmission efficiency through upper beam path 50 is provided by quadrupole doublet 52.

Pretzel magnet 54 deflects upper beam 50 through 270° vertically upward into four quadrupole singlets 56 which direct it into pretzel magnet 58. Pretzel magnet 58 deflects upper beam 50 through 270° horizontally into three quadrupole singlets 60 which direct it into pretzel magnet 62. Pretzel magnet 62 deflects upper beam 50 through a further 270° of rotation vertically downward into upper scanning magnet 64. Upper scanning magnet 64 is of a design that is conventional in the art of electron beam irradiation and employs a continuously varying magnet field to sweep the beam over the upper surface of product 66. Product 66 is typically carried on an article transport conveyor (not shown) in a direction that is approximately normal to the plane in which upper beam 50 is swept by upper scanning magnet 64.

Lower beam 51 follows a complementary beam path to that of upper beam 50. Lower beam 51 passes through quadrupole doublet 70 (shown behind quadrupole doublet 52 in FIG. 4), is rotated 270° by pretzel magnet 72 vertically downward into four quadrupole singlets 74, is rotated 270° by pretzel magnet 76 horizontally into three quadrupole singlets 42 and is rotated a further 270° by pretzel magnet 78 vertically upward into lower scanning magnet 80. Lower scanning magnet 80 sweeps lower beam 51 back and forth over the lower surface of product 66 in a plane that is approximately normal to its direction of travel.

Because switcher magnet 4 deflects beam 2 in the horizontal plane, upper and lower beam paths 51 and 52 lie in vertical planes that are displaced horizontally from one another. This arrangement ensures that upper and lower beams 50 and 51 that are swept by scanning magnets 64 and 80 are not incident on one another and therefore do not inadvertently irradiate the components of the complementary beam path which could cause damage to radiation sensitive components that are essential to the accelerator's operation.

Electron beam accelerators involve high capital cost and high operating costs. In many applications, commercial viability of electron beam accelerators requires that different articles from different manufacturing sources be assembled for treatment at the same facility at the same time. The present invention permits a single electron beam to be switched between two different conveyors carrying different products. For example, the present invention permits sterilizing of medical products in one beam line while in another shielded room, polymer components are being cross-linked for use in the aviation industry. A further advantage of the present invention is the ability to deliver widely differing doses to each of the product lines being treated.

Figure 5:
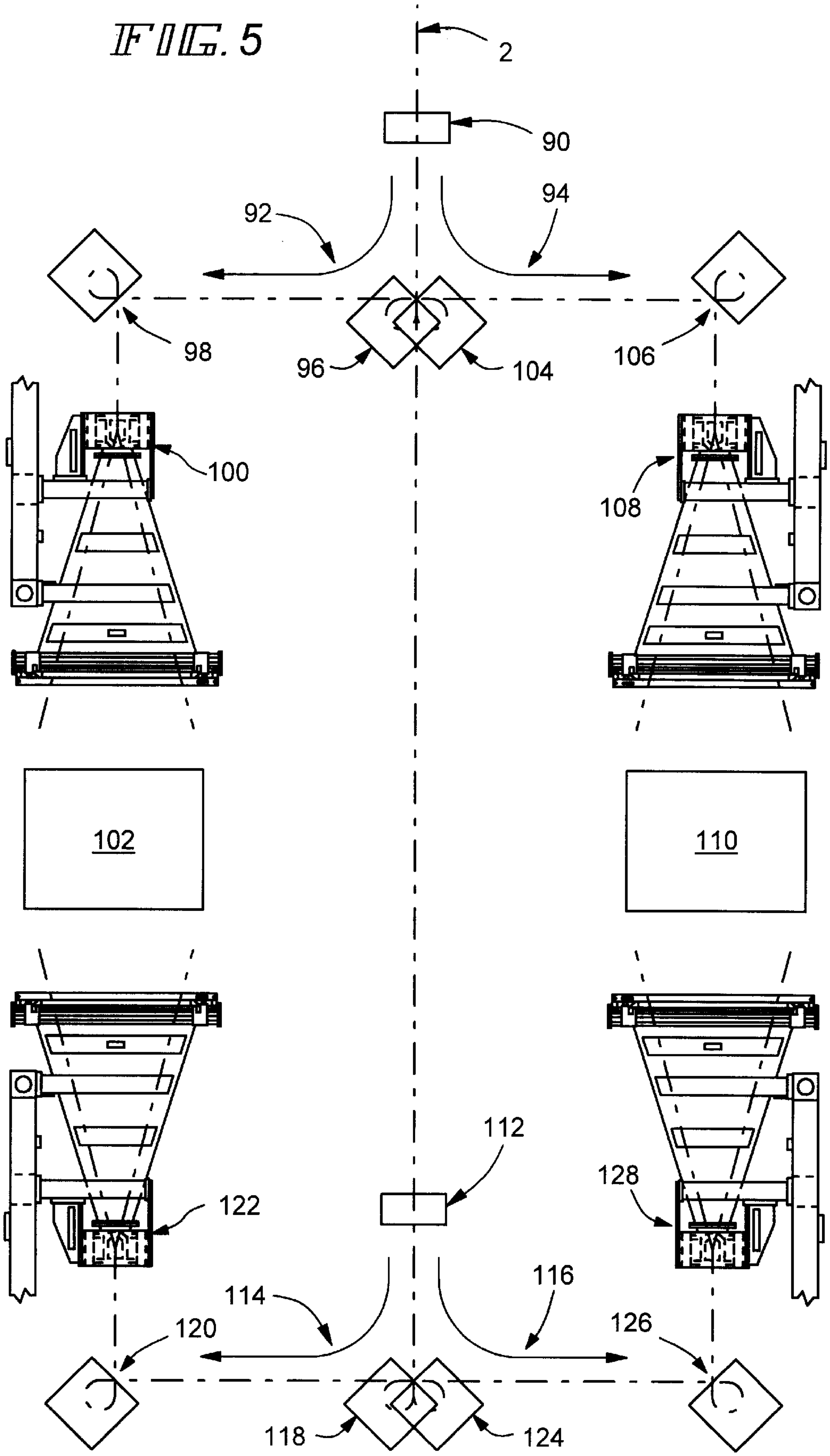
FIG. 5 is a schematic plan view of an apparatus for splitting a pulsed electron beam into two independent beams and applying the beams to two separate articles to be irradiated from opposite directions.

Referring now to FIG. 5, there is shown an alternative embodiment of the present invention in which the beam is split and delivered to two different articles. First beam switching magnet 90 splits electron beam 2 into upper left beam path 92 and upper right beam path 94 in the same manner as described with reference to FIG. 1. In the representation of FIG. 5, beam 2 is deflected 15° into and out of the plane of the paper.

Referring to upper left beam path 92, beam 2 as it is deflected by first switching magnet 90 is passed through pretzel magnet 96 which operates in dc mode and deflects the beam to the left. Pretzel magnet 98 deflects the beam into scan horn 100 which sweeps the beam downwardly over the upper surface of first article 102 to be irradiated. Upper right beam 94 follows a complementary path through pretzel magnets 102 and 104 into scan horn 108 which sweeps the beam downwardly over the upper surface of the second article 110 to be irradiated. The ratio of pulses of beam 2 can be selected to determine the respective power in the upper left and right beam paths.

Irradiation from the bottom is achieved with switching magnet 90 turned off. Beam 2 passes directly through the gap of first switching magnet 90 to second switching magnet 112 which deflects beam 2 into and out of the plane of the paper into lower left beam path 114 and lower right beam path 116, depending upon the polarity of the power supply current. Referring to lower left beam path 114, beam 2 as it is deflected by second switching magnet 112 is passed through pretzel magnet 118 which operates in dc mode and deflects the beam to the left. Pretzel magnet 120 deflects the beam into scan horn 122 which sweeps the beam upwardly over the lower surface of first article 102 to be irradiated. Lower right beam 116 follows a complementary path through pretzel magnets 124 and 126 into scan horn 128 which sweeps the beam upwardly over the lower surface of the second article 110 to be irradiated. The ratio of pulses of beam 2 can again be selected to determine the respective power in the lower left and right beam paths.

While omitted from FIG. 5 for ease of illustration, quadrupoles are used in the same manner as described with reference to FIG. 4 to adjust the optical properties of beam 2 and left, right, upper and lower beam paths 92, 94, 114, 116.

In the event that the first and second articles 102 and 110 being treated by left and right beam paths require different irradiation doses, a first predetermined number of successive beam pulses can be switched into the left beam paths and thereafter a second predetermined number of successive beam pulses can be switched into the right beam paths. With such an arrangement, by selecting the number of beam pulses to be switched into the various beam paths, different articles requiring different dose levels can be simultaneously irradiated.

The present invention offers a number of advantages over conventional irradiation techniques. Splitting the accelerated beam and applying it to opposite sides of a single article increases the dose uniformity of exposure over that from a single pass of the article through the electron beam. In addition, when an article is irradiated from two sides, the depth of penetration of the electrons is increased by about 120% over single sided irradiation. This is because regulatory authorities typically require a minimum dose for sterilization. Regions of the article where the dose is less than the required minimum are not considered to have been sterilized and are considered to be wasted. However, when the article is irradiated from opposite sides, not only is the penetration doubled, but underdosed regions previously wasted, are supplemented to make the dose more uniform and permit a larger volume to meet the required minimum. Depending on the angle of incidence of the particles and their energy distribution, the net penetration gain over one-sided irradiation is 110 to 130%. In accordance with the present invention, a 10 MeV accelerator can be made to have the equivalent penetration of a 22 MeV accelerator without rendering the article radioactive and without an increase in the amount of shielding required.

While the present invention has been described in association with the IMPELA irradiator, other pulsed beam irradiators are suitable for use in the present invention. Similarly, while the invention has been described in association with a certain power supply and magnetic switching characteristics, others designs are also suitable so long as they are effective to establish the required magnetic beam deflection field in the beam OFF interval and maintain it at a constant level throughout the beam ON interval.

We claim:

1. An apparatus for delivering a beam of charged particles along two separate beam paths comprising:

a pulsed charged particle beam source for producing a series of beam pulses along a first beam path;

switching magnet for developing a magnetic field;

power supply means for selectively applying current pulses to said switching magnet synchronized to each of a plurality of predetermined beam pulses effective to develop a constant magnetic field throughout the period of each predetermined beam pulse and deflect each entire predetermined beam pulse from said first beam path to a second beam path.

2. The apparatus of claim 1 including means for directing said first and second beam path pulses to opposite sides of an article to be irradiated.

3. The apparatus of claim 1 including means for directing said first and second beam path pulses to first and second articles to be irradiated.

4. An apparatus for delivering a beam of charged particles along two separate beam paths comprising:

a pulsed charged particle beam source for producing a series of beam pulses;

switching magnet responsive to a first and second current for developing a first and second magnetic field;

power supply means for selectively applying to said switching magnet a first current pulse synchronized to each of a plurality of predetermined first path beam pulses effective to develop a constant first magnetic field throughout the period of each predetermined first path beam pulse and thereby deflect each entire predetermined first path beam pulse to said first beam path, and a second current pulse synchronized to each of a plurality of predetermined second path beam pulses effective to develop a constant second magnetic field throughout the period of each predetermined second path beam pulse and thereby deflect each entire predetermined second path beam pulse to said second beam path.

5. The apparatus of claim 4 wherein the first and second current pulses are of opposite polarity.

6. The apparatus of claim 4 wherein successive beam pulses are alternately predetermined first and second path beam pulses.

7. The apparatus of claim 4 wherein successive pluralities of beam pulses are alternately predetermined first and second path beam pulses.

8. The apparatus of claim 7 wherein the successive pluralities have an equal number of beam pulses.

9. The apparatus of claim 7 wherein the successive pluralities have an unequal number of beam pulses.

10. The apparatus of claim 4 including means for directing said first and second beam path pulses to opposite sides of an article to be irradiated.

11. The apparatus of claim 10 wherein said means for directing includes magnetic scanning horns.

12. The apparatus of claim 10 wherein said first and second beam paths lie in spaced parallel planes such that each is not incident on the other beam path.

13. The apparatus of claim 4 including means for directing said first and second beam path pulses to first and second articles to be irradiated.

14. The apparatus of claim 13 wherein said means for directing includes magnetic scanning horns.

15. An apparatus for delivering a beam of charged particles along four separate beam paths comprising:

a pulsed charged particle beam source for producing a series of beam pulses along a linear axis;

first switching magnet responsive to a first and second current for developing a first and second magnetic field;

second switching magnet responsive to a third and fourth current for developing a third and fourth magnetic field;

power supply means for selectively applying to said first switching magnet a first current pulse synchronized to each of a plurality of predetermined first path beam pulses effective to develop a constant first magnetic field throughout the period of each first path beam pulse and thereby deflect each entire first path beam pulse from said linear axis to a first beam path, and a second current pulse synchronized to each of a plurality of predetermined second path beam pulses effective to develop a constant second magnetic field throughout the period of each second path beam pulse and thereby deflect each entire second path beam pulse from said linear axis to a second beam path, and for selectively applying to said second switching magnet a third current pulse synchronized to each of a plurality of predetermined third path beam pulses effective to develop a constant third magnetic field throughout the period of each third path beam pulse and thereby deflect each entire third path beam pulse from said linear axis to a third beam path, and a fourth current pulse synchronized to each of a plurality of predetermined fourth path beam pulses effective to develop a constant fourth magnetic field throughout the period of each predetermined fourth path beam pulse and thereby deflect each entire fourth path beam pulse from said linear axis to a fourth beam path.

16. The apparatus of claim 15 wherein the first and second current pulses are of opposite polarity and the third and fourth pulses are of opposite polarity.

17. The apparatus of claim 15 wherein successive beam pulses are alternately predetermined first, second, third and fourth path beam pulses.

18. The apparatus of claim 15 wherein successive pluralities of beam pulses are alternately predetermined first, second, third and fourth path beam pulses.

19. The apparatus of claim 15 wherein the successive pluralities have an equal number of beam pulses.

20. The apparatus of claim 15 wherein the successive pluralities have an unequal number of beam pulses.

21. The apparatus of claim 15 including means for directing said first and third beam path pulses to opposite sides of a first article to be irradiated and for directing said second and fourth beam path pulses to opposite sides of a second article to be irradiated.

22. The apparatus of claim 21 wherein said means for directing includes magnetic scanning horns.

23. The apparatus of claim 21 wherein said first and third beam paths lie in spaced parallel planes such that each is not incident on the other and said second and fourth beam paths lie in spaced parallel planes such that each is not incident on the other.

24. A method for delivering a beam of charged particles along two separate beam paths comprising:

producing from a pulsed charged particle beam source a series of beam pulses along a first beam path;

directing said first beam path through the field of a switching magnet;

selectively applying current pulses to said switching magnet synchronized to each of a plurality of predetermined beam pulses effective to develop a constant magnetic field throughout the period of each predetermined beam pulse and thereby deflect each entire predetermined beam pulse from said first beam path to a second beam path.

25. An method for delivering a beam of charged particles along two separate beam paths comprising:

producing from a pulsed charged particle beam source a series of beam pulses along a linear axis;

directing said axis through the field of a switching magnet;

selectively applying to said switching magnet a first current pulse synchronized to each of a plurality of predetermined first path beam pulses effective to develop a constant first magnetic field throughout the period of each predetermined first path beam pulse and thereby deflect each entire predetermined first path beam pulse to said first beam path, and a second current pulse synchronized to each of a plurality of predetermined second path beam pulses effective to develop a constant second magnetic field throughout the period of each predetermined second path beam pulse and thereby deflect each entire predetermined second path beam pulse to said second beam path.

26. An method for delivering a beam of charged particles along four separate beam paths comprising:

producing from a pulsed charged particle beam source a series of beam pulses along a linear axis;

directing said axis through the field of a first and second switching magnet displaced longitudinally along said axis;

selectively applying to said first switching magnet a first current pulse synchronized to each of a plurality of predetermined first path beam pulses effective to develop a constant first magnetic field throughout the period of each first path beam pulse and thereby deflect each entire first path beam pulse from said linear axis to a first beam path, and a second current pulse synchronized to each of a plurality of predetermined second path beam pulses effective to develop a constant second magnetic field throughout the period of each second path beam pulse and thereby deflect each entire second path beam pulse from said linear axis to a second beam path;

selectively applying to said second switching magnet a third current pulse synchronized to each of a plurality of predetermined third path beam pulses effective to develop a constant third magnetic field throughout the period of each third path beam pulse and thereby deflect each entire third path beam pulse from said linear axis to a third beam path, and a fourth current pulse synchronized to each of a plurality of predetermined fourth path beam pulses effective to develop a constant fourth magnetic field throughout the period of each predetermined fourth path beam pulse and thereby deflect each entire fourth path beam pulse from said linear axis to a fourth beam path.

* * * * *